(12) United States Patent
Seyama

(10) Patent No.: US 6,441,611 B2
(45) Date of Patent: Aug. 27, 2002

(54) MAGNETIC SENSOR HAVING A GMR LAYER

(75) Inventor: Yoshihiko Seyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/749,310

(22) Filed: Dec. 27, 2000

Related U.S. Application Data

(63) Continuation of application No. PCT/JP99/03161, filed on Jun. 14, 1999.

(30) Foreign Application Priority Data

Jul. 8, 1998 (JP) .............................. 10-193152

(51) Int. Cl.⁷ .................... G01R 33/09; G11B 5/39; H01L 43/08
(52) U.S. Cl. ................. 324/252; 338/32 R; 360/119; 360/324; 428/900
(58) Field of Search ................ 324/207.21, 252; 338/32 R; 360/313, 319, 320, 322, 324, 326, 327; 365/158; 257/421; 428/692, 693, 694 R, 900

(56) References Cited

U.S. PATENT DOCUMENTS

| | | | | |
|---|---|---|---|---|
| 5,351,158 A | * | 9/1994 | Shibata | 360/322 |
| 5,675,459 A | * | 10/1997 | Sato et al. | 360/325 |
| 5,822,158 A | * | 10/1998 | Matsuzono | 360/324 |
| 6,114,719 A | * | 9/2000 | Dill et al. | 257/421 X |

FOREIGN PATENT DOCUMENTS

| | | |
|---|---|---|
| JP | 5-151533 A | 6/1986 |
| JP | 4-123306 A | 4/1992 |
| JP | 06302877 A | 10/1994 |
| JP | 7-262520 | 10/1995 |
| JP | 09128719 A | 5/1997 |
| JP | 61-126618 A | 6/1998 |
| JP | 10-209521 | * 8/1998 |

* cited by examiner

Primary Examiner—Gerard R. Strecker
(74) Attorney, Agent, or Firm—Greer, Burns & Crain, Ltd.

(57) ABSTRACT

A magnetic sensor utilizing a giant magnetoresistance (GMR) effect, wherein an insulation layer with a contact hole is formed on a lower terminal layer, a GMR layer is formed thereover on the region including the entire contact hole and at least the surrounding insulation layer, and an upper terminal layer is formed thereover. The sensor offers several advantages in that it is easy to manufacture and is compact, and has a high degree of resistance change.

5 Claims, 6 Drawing Sheets

MAGNETIC SENSOR HAVING A GMR LAYER

CROSS-REFERENCE TO RELATED APPLICATIONS

This application is based upon and claims priority of Japanese Patent Application No. Hei 10-193152, filed on Jul. 8, 1998, the contents being incorporated herein by reference, and a continuation of PCT/JP99/03161, filed Jun. 14, 1999.

BACKGROUND OF THE INVENTION

1. Field of the Invention

The present invention relates to a magnetic sensor.

The magnetic sensor is used primarily as a magnetic head for a hard disk drive serving as a recording device in a computer. Conventional hard disk drive magnetic heads sense magnetic fields by an induction current generated in a coil. However, with recent demands for higher recording density and higher speed, magnetic sensors that directly sense magnetic fields themselves have begun to be used in magnetic heads. Due to the higher recording density of hard disk drives, the reduction in the 1 bit recording area results in a smaller generated magnetic field. Thus, magnetic sensors that are small and can sense small changes in external magnetic fields are desirable.

2. Description of the Related Art

The magnetic heads that are currently in wide use are magnetic sensors that utilize a magnetoresistance effect (hereunder referred to as "MR effect"). The MR effect is a change in the magnetoresistance according to the strength of the external magnetic field, when the external magnetic field direction and the current direction are different for a magnetic material. Recording density is vastly improved with a magnetic head utilizing the MR effect. However, there is high demand for further improvement in recording density, and a trend is underway toward the use of magnetic heads utilizing giant magnetoresistance effect (hereunder referred to as "GMR effect"), which involves a greater resistance change than the MR effect and is expected to provide even better recording density in the latest generation of magnetic heads.

The magnetic head uses spin-valve GMR. This is an MR ratio of about 7%, and is thought to be applicable up to a recording density of 10–20 Gbit/in$^2$.

However, recent improvements in hard disk drive recording density have been drastic, and a recording density of 40 Gbit/in$^2$ has been set as a goal for 2002. With this level of recording density, the MR ratio must be at least 10%. The recording bit size will have a track width of 0.3 μm or smaller and a bit length of 0.07 μm or smaller. Consequently, it will be desirable to have a GMR film thickness of no greater than 0.07 μm (700 Å), and assuming insulation layer thicknesses of 200 Å each for the upper and lower magnetic shields, it must be no greater than 0.03 μm (300 Å).

GMR films with a multilayer structure are expected to be used to meet this demand. In multilayer GMR films, the external magnetic field required for resistance change is as large as a few kOe or more for the "first peak," i.e., the thickness of a non-magnetic layer of the GMR film of about 1 nm, which gives the largest MR ratio (30–50%). On the other hand, the MR ratio a "second peak," ie., the thickness of the non-magnetic layer of about 2 nm, is 10–20%, but the external magnetic field required for a resistance change is as small as about 100 Oe, so that it is believed to be suitable for use in magnetic heads.

Furthermore, multilayer GMR films are known to have an MR ratio, when the current flows perpendicular to the film surface (CPP, Current Perpendicular to the Plane), which is about twice that compared to when the current flows parallel to the film surface (CIP, Current In Plane), at room temperature. In this case, the element structure is generally as shown in FIG. 1. The element has greater resistance and a greater degree of resistance change, with a smaller cross-sectional area of the element. That is, while it offers the advantage of suitability for narrower track widths, its disadvantages include a greater thickness due to the upper and lower element layers and greater difficulty in forming the insulation layer and element member (greater alignment precision is necessary).

BRIEF SUMMARY OF THE INVENTION

It is an object of the present invention to overcome these problems of the prior art by providing a magnetic sensor which is easy to manufacture and is compact, and which has a high degree of resistance change.

In order to achieve this object, the invention provides a magnetic sensor utilizing GMR effect, wherein an insulation layer with a contact hole is formed on a lower terminal layer, a GMR layer is formed thereover on the region including the entire contact hole and at least the surrounding insulation layer, and an upper terminal layer is formed thereover.

According to another aspect of the invention, the upper terminal layer and the lower terminal layer simultaneously provide magnetic shield layer functions.

DETAILED DESCRIPTION OF THE INVENTION

In the magnetic sensor of the invention, the GMR layer preferably has a multilayer film structure of CoFe/Cu or Co/Cu. The insulation layer may be, for example, SiO$_2$.

Figure 2:
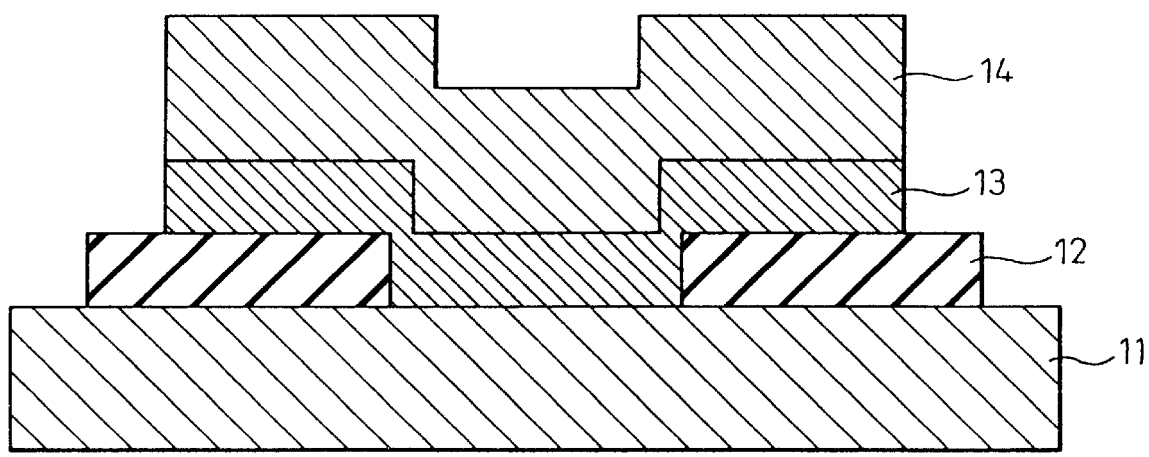
FIG. 2 is a schematic cross-sectional view of an embodiment of an element structure for a magnetic sensor according to the present invention.

FIG. 2 shows an element structure for a magnetic sensor according to the invention. The element comprises a lower terminal layer 11, an insulation layer 12, a GMR layer 13 and an upper terminal layer 14. Here, the lower terminal layer and upper terminal layer are made of Cu films, for example.

Figure 3:
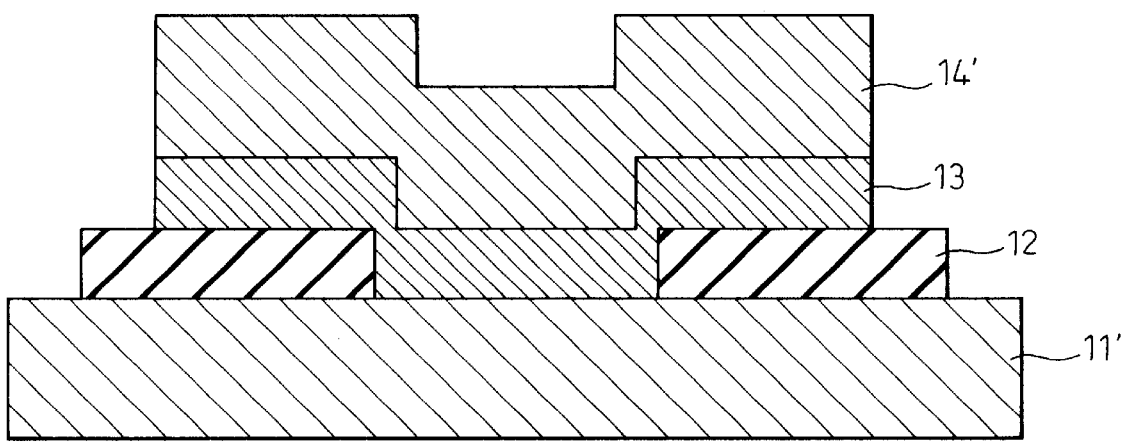
FIG. 3 is a schematic cross-sectional view of another embodiment of an element structure for a magnetic sensor according to the present invention.

In a magnetic sensor having the element structure shown in FIG. 3, the lower terminal layer 11' and upper terminal layer 14' also both function as magnetic shield layers. The lower terminal layer and upper terminal layer may be composed of NiFe films, for example. By employing this type of construction, it is possible to make the distance between magnetic shields equivalent to the GMR layer thickness, and thus drastically reduce the distance between the magnetic shields.

Figure 5:
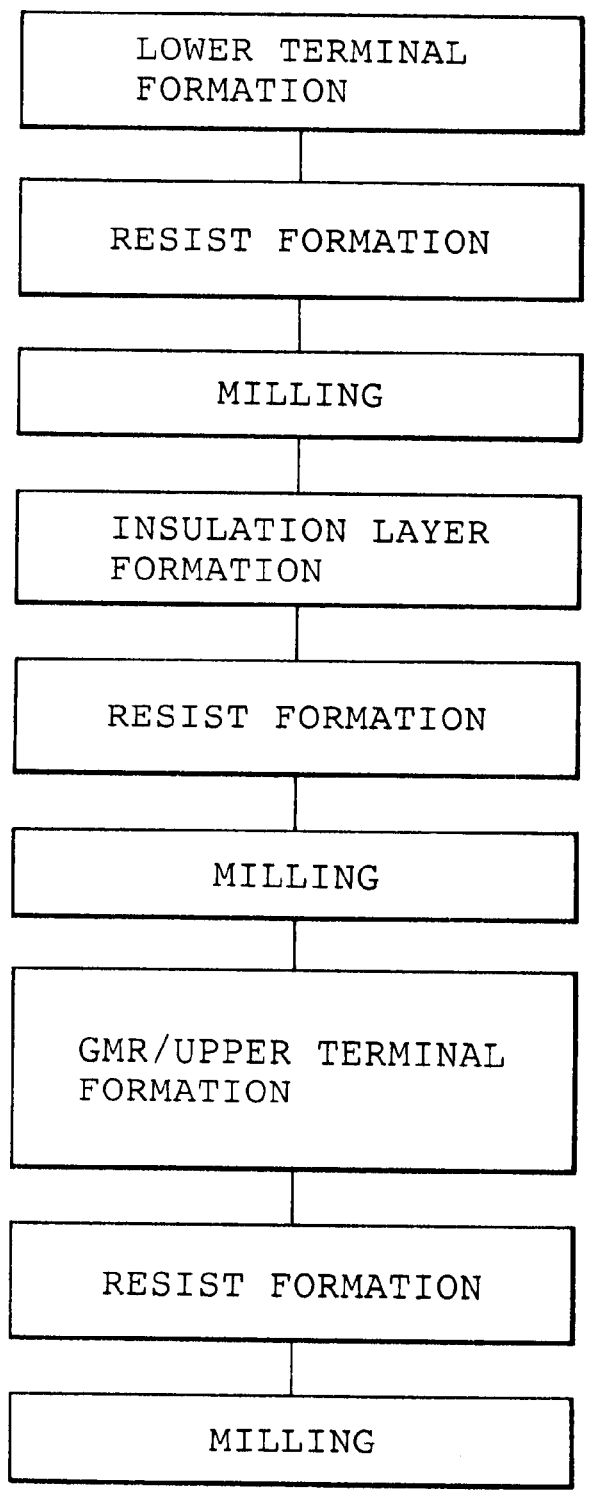
FIG. 5 is an illustration of a manufacturing process for a magnetic sensor according to the invention.

For manufacture of a magnetic sensor having the element structure shown in FIG. 2 or FIG. 3, for example, the lower terminal layer 11 is first formed as shown in FIG. 5 on an Si substrate (not shown) and, after forming a resist pattern thereover, it is subjected to milling into the lower terminal shape. Next, the insulation layer 12 is formed thereover, a resist pattern is formed and milling is again performed to form a contact hole, after which the GMR layer 13 is formed. The upper terminal layer 14 is then formed thereover, and another resist pattern is formed for milling into the upper terminal shape.

Figure 1:
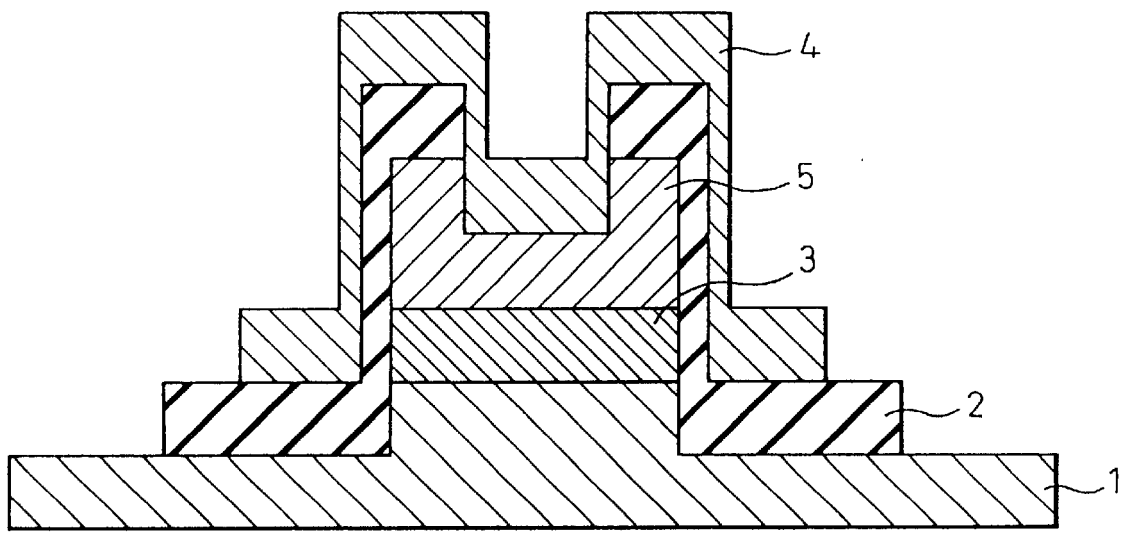
FIG. 1 is a schematic cross-sectional view of an embodiment of an element structure for a conventional magnetic sensor.
Figure 4:
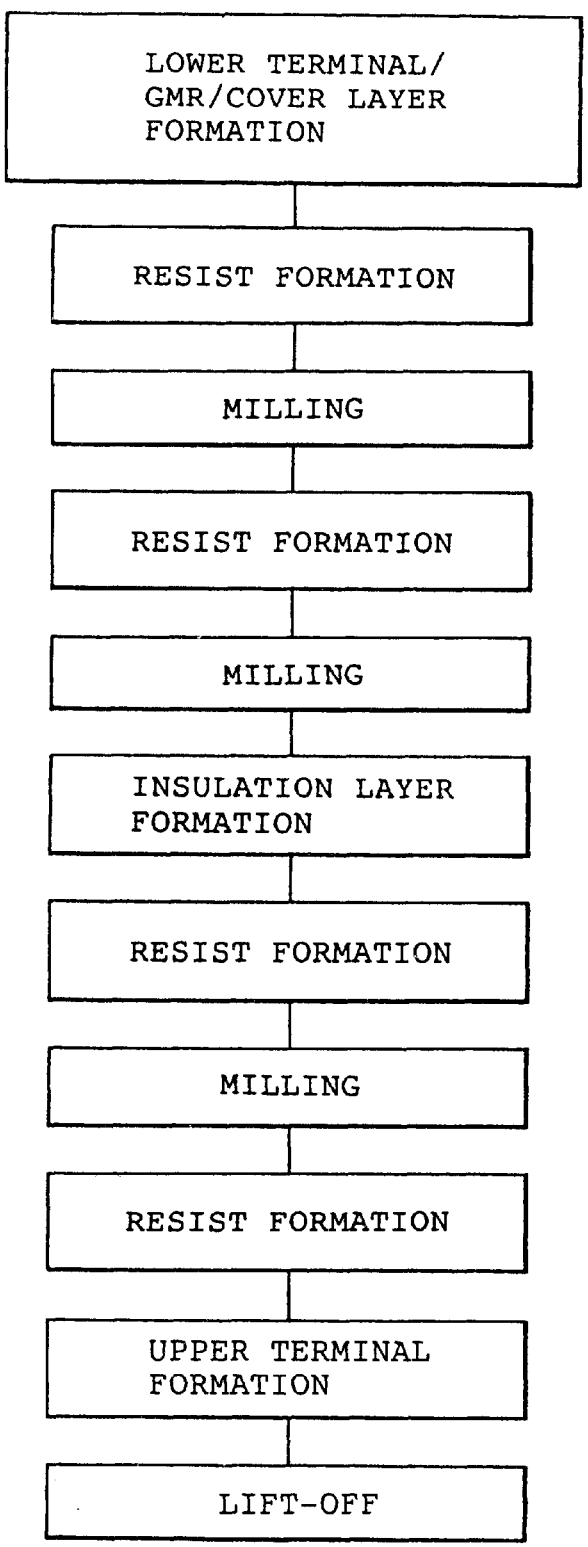
FIG. 4 is an illustration of a manufacturing process for a conventional magnetic sensor.

On the other hand, for manufacture of a magnetic sensor having the element structure shown in FIG. 1, a lower terminal layer 1, GMR layer 3 and cover layer 5 are formed in that order as shown in FIG. 4 on an Si substrate (not shown), after which a resist pattern is formed thereover, milling is performed on these layers to form the desired shapes, and then an insulation layer 2 is formed thereover. A resist pattern is then formed and subjected to milling to form a contact hole. A resist pattern is formed thereover and then an upper terminal layer 4 is formed before lift-off.

In a conventional magnetic sensor, therefore, the manufacturing process has required formation of the insulation layer after two milling steps, and then a milling step for formation of the contact hole. Extremely high alignment precision has therefore been necessary for resist pattern formation. For manufacture of a magnetic sensor according to the invention, however, the GMR layer and upper terminal layer are formed after formation of the contact hole while the resist pattern formation and milling are carried out thereafter, so that no high precision alignment is necessary.

With a conventional magnetic sensor, milling is carried out 3 times after formation of the GMR layer and this has posed a high risk of processing damage to the GMR layer; however, the magnetic sensor of the invention requires only one milling operation after formation of the GMR layer, and therefore the risk of processing damage is advantageously lower.

The magnetic sensor of the invention offers the advantage of easier manufacture as explained above, but has the additional advantage of being compact and allowing the contact hole to be reduced in size, thus resulting in a larger resistance change.

Furthermore, the magnetic sensor of the invention offers another advantage in that the sensitivity is not easily reduced even with a smaller GMR diameter. This is because the magnetic sensor of the invention is not greatly affected by demagnetizing fields, and hence there is no increase in the saturated external magnetic field ($H_S$) even when the GMR diameter is small.

The present invention will now be explained in greater detail by way of examples.

EXAMPLE 1

Following the process illustrated in FIG. 5, a magnetron sputtering apparatus was used to form a 5000 Å Cu film as a lower terminal layer on an Si substrate, this was coated with a resist by spin coating and exposed to light for development to form a resist pattern, and milling was carried out using argon ions to make a lower terminal shape. A CVD apparatus was then used to form a 500 Å TEOS-SiO$_2$ film as an insulation layer, and resist pattern formation and milling were carried out in the same manner as above to form a contact hole with a diameter of 1 µm. Next, a magnetron sputtering apparatus was used to form a 50 Å CoFe/[11 Å CoFe/22 Å Cu]×10 film as a multilayer structure GMR layer, and then a 2000 Å Cu film was formed as the upper terminal layer, a resist pattern was formed in the same manner as above, and milling was performed to form the upper terminal shape. This resulted in a magnetic sensor with the element structure shown in FIG. 2.

COMPARATIVE EXAMPLE 1

Following the process illustrated in FIG. 4, the same procedure as Example 1 was carried out to form a 5000 Å Cu film as the lower terminal layer, a 50 Å CoFe/[11 Å CoFe/22 Å A Cu]×10 film as the GMR layer and a 2000 Å Cu film as the cover layer, and then milling was performed twice to form the lower terminal layer in the desired shape and the GMR layer (2 µm diameter). A 500 Å TEOS-SiO$_2$ insulation film was formed thereover, and after forming a resist pattern, milling was performed to form a contact hole (1.6 µm diameter). After then forming a lift-off resist pattern, a 1000 Å Cu film was formed as the upper terminal layer and the resist pattern was lifted off to obtain a magnetic sensor with the element structure shown in FIG. 1.

The samples obtained in Example 1 and Comparative Example 1 described above were used for measurement of the MR curve at an applied magnetic field of ±200 Oe, and the MR ratio by the direct current 4-terminal method.

The samples obtained in Example 1 and Comparative Example 1 described as above were used for measurement of the MR curve at an applied magnetic field of ±200 Oe, and the MR ratio by the direct current 4-terminal method. The defect rate, including continuity defects, was less than 10% with the element of Example 1, but was over 50% with the element of Comparative Example 1 , Also, the MR ratio of the element of Example 1 was 34%, while that of the element of Comparative Example 1 was 12%. This was because the resistance of the Cu layer above and below the GMR layer in the element of Comparative Example 1 constitued part of the element resistance.

EXAMPLE 2

The procedure of Example 1 was repeated, but for this example a 10,000 Å NiFe film was formed instead of the 5000 Å Cu film as the lower terminal layer and a 10,000 Å NiFe film instead of the 2000 Å Cu film as the upper terminal layer, to obtain sample 1. The NiFe layers were formed by ordinary plating film formation methods. In this sample, the surface of the NiFe layer was rougher compared to the Cu layer obtained by sputtering film formation in Example 1.

The defect rate of sample 1 was 23%, and the MR ratio was 32%. The sample had a high defect rate, but this was believed to be a result of the rough surface of the NiFe layers formed by plating film formation, which tended to result in contact defects with the GMR layer.

Thus, in order to reduce the roughness of the surface of the NiFe layer, a magnetron sputtering apparatus was used to form a 100 Å Cu layer between the NiFe lower terminal layer and the GMR layer, and between the NiFe upper terminal layer and the GMR layer.

The defect rate of sample 2 was 9%, and the MR ratio was 35%. By thus forming a Cu sputtered layer between the upper and lower terminal layers and the GMR layer, the defect rate was improved and it was possible to obtain a magnetic sensor with an element structure having upper and lower terminal layers providing a magnetic shield function, as shown in FIG. 3.

EXAMPLE 3

The procedure in Example 1 was repeated, but in this case the diameter of the contact hole was changed to obtain a magnetic sensor having the element structure shown in FIG. 2, with different GMR diameters.

Figure 6:
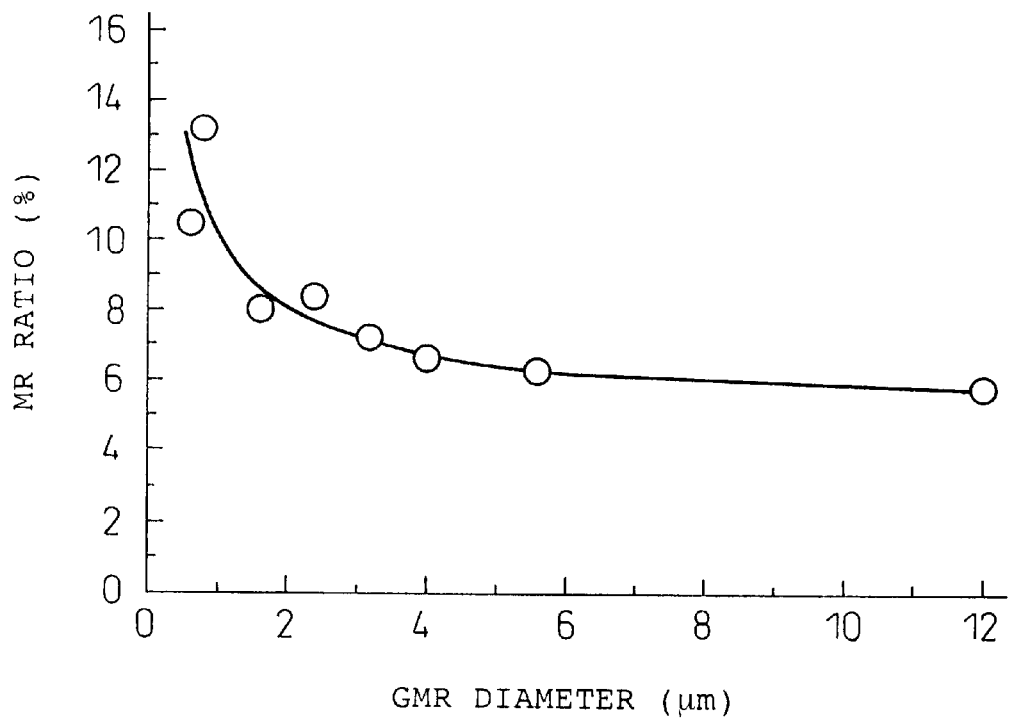
FIG. 6 is a graph showing the relationship between the GMR diameter and MR ratio for a magnetic sensor obtained as an example of the invention.
Figure 7:
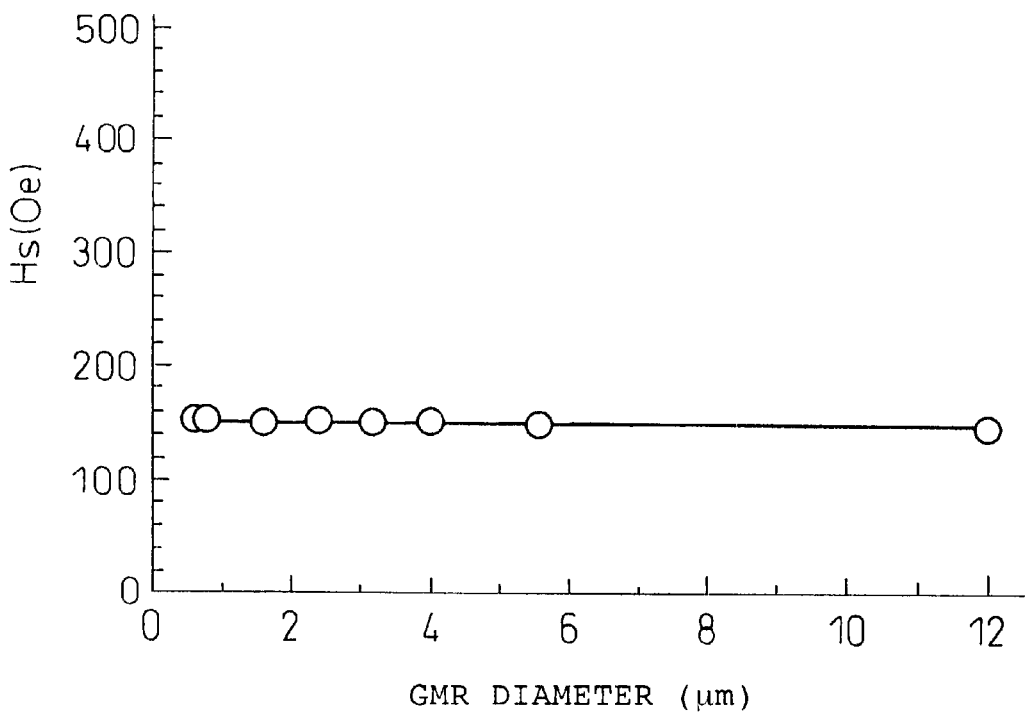
FIG. 7 is a graph showing the relationship between the GMR diameter and saturated external magnetic field for a magnetic sensor obtained as an example of the invention.
Figure 8:
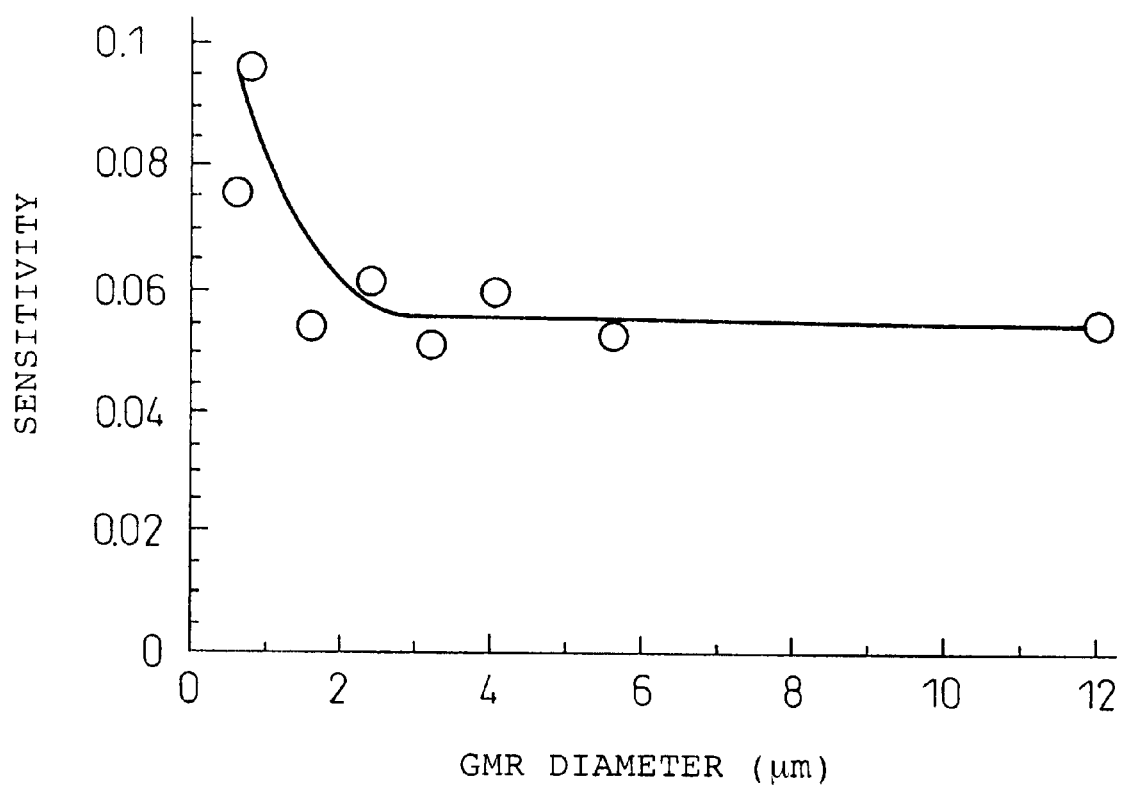
FIG. 8 is a graph showing the relationship between the GMR diameter and sensitivity for a magnetic sensor obtained as an example of the invention.

This sample was used for measurement of the MR curve at an applied magnetic field of ±500 Oe, the MR ratio and the saturated external magnetic field ($H_S$) and sensitivity, by the direct current 4-terminal method. The changes obtained in the MR ratio, $H_S$ and sensitivity (MR ratio/$H_S$) are shown in FIGS. 6, 7 and 8.

These graphs show that the magnetic sensors of the invention exhibit virtually no change in $H_S$ even with a small GMR diameter (corresponding in this case to the contact hole diameter), but since a smaller GMR diameter results in a drastically larger MR ratio, the sensitivity is also greatly improved.

The present invention can provide a magnetic sensor which is easy to manufacture is and compact, and which allows high precision in measuring resistance change, and it is therefore highly useful from an industrial standpoint.

What is claimed is:

1. A magnetic sensor utilizing a giant magnetoresistance (GMR) effect, comprising:

an electrically conductive lower terminal layer;

an insulation layer with a contact hole formed on the lower terminal layer;

a GMR layer formed on the insulation layer in a region surrounding at least the contact hole and in contact with the lower terminal layer; and an electrically conductive upper terminal layer formed on the GMR layer.

2. A magnetic sensor according to claim 1, wherein said upper terminal layer and said lower terminal layer also provide a function as magnetic shield layers.

3. A magnetic sensor according to claim 1 or 2, wherein the GMR layer has a multilayer structure.

4. A magnetic sensor according to claim 3, wherein the GMR layer has a CoFe/Cu or Co/Cu multilayer structure.

5. A magnetic sensor according to claim 2, wherein said upper terminal layer and said lower terminal layer are comprised of an NiFe film.

* * * * *